(12) United States Patent
Kim

(10) Patent No.: US 9,225,175 B2
(45) Date of Patent: Dec. 29, 2015

(54) POWER VOLTAGE SELECTION DEVICE

(71) Applicant: SK hynix Inc., Gyeonggi-do (KR)

(72) Inventor: Tae-Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 428 days.

(21) Appl. No.: 13/716,458

(22) Filed: Dec. 17, 2012

(65) Prior Publication Data

US 2014/0062204 A1    Mar. 6, 2014

(30) Foreign Application Priority Data

Aug. 31, 2012  (KR) .................. 10-2012-0096732

(51) Int. Cl.
| | |
|---|---|
| *H02J 1/00* | (2006.01) |
| *H02J 4/00* | (2006.01) |
| *H01L 27/088* | (2006.01) |
| *G06F 1/26* | (2006.01) |
| *H03K 17/693* | (2006.01) |

(52) U.S. Cl.
CPC . *H02J 4/00* (2013.01); *G06F 1/263* (2013.01); *H01L 27/088* (2013.01); *H03K 17/693* (2013.01); *Y10T 307/658* (2015.04)

(58) Field of Classification Search
USPC .......................................................... 307/87
See application file for complete search history.

(56) References Cited

U.S. PATENT DOCUMENTS

| | | | | |
|---|---|---|---|---|
| 5,966,043 | A * | 10/1999 | Jinbo ............................ | 327/530 |
| 6,563,372 | B1 * | 5/2003 | Fournel ........................ | 327/543 |
| 6,774,704 | B2 * | 8/2004 | Kushnarenko ................ | 327/530 |
| 7,005,911 | B1 * | 2/2006 | Om'mani ..................... | 327/408 |
| 7,423,472 | B2 * | 9/2008 | Hirose et al. .................. | 327/407 |
| 7,432,754 | B2 * | 10/2008 | Kase et al. .................... | 327/408 |
| 8,258,853 | B2 * | 9/2012 | Ku ................................ | 327/408 |
| 2004/0080358 | A1 * | 4/2004 | Kushnarenko ........... | G11C 8/08 327/530 |
| 2007/0205802 | A1 * | 9/2007 | Perisetty ............. | H01L 27/0921 326/27 |
| 2012/0327725 | A1 * | 12/2012 | Clark .................... | G11C 11/412 365/189.011 |
| 2013/0169363 | A1 * | 7/2013 | Chen ................... | H03F 3/45282 330/261 |
| 2013/0328414 | A1 * | 12/2013 | Sbuell .................. | H03K 17/693 307/115 |
| 2014/0062204 | A1 * | 3/2014 | Kim ................................ | 307/72 |

FOREIGN PATENT DOCUMENTS

| | | |
|---|---|---|
| KR | 1019970067329 | 10/1997 |
| KR | 1020090060204 | 6/2009 |
| KR | 1020110136854 | 12/2011 |

* cited by examiner

*Primary Examiner* — Ronald W Leja
(74) *Attorney, Agent, or Firm* — IP & T Group LLP

(57) ABSTRACT

A power voltage selection device includes a first power voltage and a second power voltage; a power selection unit having a first PMOS transistor and a second PMOS transistor, wherein the first power voltage is supplied to a source of the first PMOS transistor, a gate of the first PMOS transistor receives a first enable signal, the second power voltage is supplied to a source of the second PMOS transistor, a gate of the second PMOS transistor receives a second enable signal, and a body of the first PMOS transistor is coupled to a body of the second PMOS transistor; an output unit having a common node to which a drain of the first PMOS transistor and a drain of the second PMOS transistor are commonly coupled; and a body voltage control unit controlling to supply one of the first power voltage and the second power voltage to the bodies of the first PMOS transistor and the second PMOS transistor, wherein the one has a higher voltage level than the other.

11 Claims, 2 Drawing Sheets

POWER VOLTAGE SELECTION DEVICE

CROSS-REFERENCE TO RELATED APPLICATION

The present application claims priority of Korean Patent application No. 10-2012-0096732, filed on Aug. 31, 2012, which is incorporated herein by reference in its entirety.

BACKGROUND

1. Field

Exemplary embodiments of the present invention relate to a power voltage selection device for selecting one of a plurality of power voltages.

2. Description of the Related Art

As an electronic technology has been developed, sizes of electronic devices have been minimized. Thus, electronic devices including a laptop computer, a mobile communication device and the like are requested to operate with power voltages having various voltage levels that are supplied from various power voltage suppliers located at various places. Moreover, if a plurality of power voltages is supplied to the electronic devices, the electronic devices are requested to select one of the plurality of power voltages, and supply a selected power voltage stably irrespective of characteristics of the selected power voltage.

For example, portable electronic devices are designed to operate with various power voltages supplied from an alternating current (AC) power adapter or a battery. If the AC power adapter is coupled to the portable electronic devices, a power voltage is supplied from the AC power adapter to the portable electronic devices. If the AC power adapter is not coupled to the portable electronic devices, a power voltage is supplied from the battery included in the portable electronic devices to the portable electronic devices.

In other words, if the external power voltage is supplied to the electronic devices, the electronic devices operate with the external power voltage, and if an external power voltage is not supplied to the electronic devices, the electronic devices operate with an internal power voltage. These electronic devices are thus requested to select one of a plurality of power voltages.

FIG. 1 is a circuit diagram illustrating a conventional power voltage selection device.

Referring to FIG. 1, a conventional power voltage selection device includes a power voltage selection unit 10 and an output unit 20.

The power voltage selection unit 10 includes a first PMOS transistor P11 and a second PMOS transistor P12.

A first enable signal EN_1 is input to a gate of the first PMOS transistor P11. A source and a body of the first PMOS transistor P11 are coupled to each other. A first power voltage VDD1 is coupled to the source of the first PMOS transistor P11. A second enable signal EN_2 is input to a gate of the second PMOS transistor P12. A source and a body of the second PMOS transistor P12 are coupled to each other. A second power voltage VDD2 is coupled to the source of the second PMOS transistor P12. A drain of the first PMOS transistor P11 is coupled to a drain of the second PMOS transistor The output unit 20 includes an output node VOUT, and supplies a selected power voltage to an external device (not shown) through the output node VOUT. The drain of the first PMOS transistor P11 and the drain of the second PMOS transistor are commonly coupled to the output node VOUT.

An operation of the conventional power voltage selection device will be described as below.

In operation, the first power voltage VDD1 is output to the output node VOUT in response to the first enable signal EN_1 that is input to the gate of the first PMOS transistor P11. Alternatively, the second power voltage VDD2 is output to the output node in response to the second enable signal EN_2 that is input to the gate of the second PMOS transistor P12.

More specifically, if the first enable signal EN_1 having a low voltage level of a ground voltage or a negative voltage is input to the gate of the first PMOS transistor P11, the first PMOS transistor P11 is turned on in response to the first enable signal EN_1, and the first power voltage VDD1 is output to the output node VOUT. If the second enable signal EN_2 having a low voltage level of a ground voltage or a negative voltage is input to the gate of the second PNOS transistor P12, the second PNOS transistor P12 is turned on in response to the second enable signal EN_2, and the second power voltage VDD2 is output to the output node VOUT. Since the first enable signal EN_1 and the second enable signal EN_2 do not have a low voltage level at the same time, the first PMOS transistor P11 and the second transistor P12 are not turned on at the same time.

FIG. 2 is a cross sectional view of a conventional PMOS transistor.

As shown in FIG. 2, a PMOS transistor includes a drain coupling terminal 11_1 a gate coupling terminal 11_2, a source coupling terminal 11_3 an oxide layer 11_4, a P-type doped substrate 11_5, an N-type doped well 11_6, a P-type doped drain 11_7 and a P-type doped source 11_8.

The PMOS transistor also includes a first parasitic diode 11_A, a second parasitic diode 11_B and a third parasitic diode 11_C. The N-type doped well 11_6 is diffused in the P-type doped substrate 11_5. The first parasitic diode 11_A is formed along a boundary between the N-type doped well 11_6 and the P-type doped substrate 11_5.

The P-type doped drain 11_7 and the P-type doped source 11_8 are diffused in the N-type doped well 11_6. The second parasitic diode 11_B is formed between the P-type doped drain 11_7 and the N-type doped drain well 11_6, and the third parasitic diode 11_C is formed between the p-type doped source 11_8 and the N-type doped well 11_6.

The first parasitic diode 11_A and the second parasitic diode 11_B form a parasitic bipolar junction transistor (BJT). The first parasitic diode 11_1 and the third parasitic diode 11_C form a parasitic BJT.

Referring to FIGS. 1 and 2, if a delay occurs in a power-up sequence of the first power voltage VDD1 and the second power voltage VDD2, a latch-up occurs in the PMOS transistor of the conventional power voltage selection device. The latch-up is defined as a phenomenon that a parasitic transistor is turned on and an unwanted current flows due to a mutually amplified operation.

For example, if the second power voltage VDD2 is supplied to the source of the second PMOS transistor P12 while the first power voltage VDD1 is not supplied to the source of the first PMOS transistor P11, and the source of the first PMOS transistor P11 has a ground voltage, the body of the first PMOS transistor P11 coupled to the first power voltage VDD1 has a ground voltage, and the second power voltage VDD2 is supplied to the drain of the first PMOS transistor P11.

If a voltage difference between the body and the drain of the first PMOS transistor P11 is higher than a threshold voltage, the parasitic transistor is turned on and the latch-up occurs.

As described above, in a conventional system, a large amount of current is input to an integrated circuit due to the latch-up caused by the parasitic transistor, which may increase a power consumption of a semiconductor device and heat the semiconductor device.

SUMMARY

Exemplary embodiments of the present invention are directed to a power voltage selection device for performing a latch-up protection operation.

In accordance with an exemplary embodiment of the present invention, a power voltage selection device includes a first power voltage and a second power voltage; a power selection unit configured to have a first PMOS transistor and a second PMOS transistor, wherein the first power voltage is supplied to a source of the first PMOS transistor, a gate of the first PMOS transistor receives a first enable signal, the second power voltage is supplied to a source of the second PMOS transistor, a gate of the second PMOS transistor receives a second enable signal, and a body of the first PMOS transistor is coupled to a body of the second PMOS transistor; an output unit having a common node to which the drain of the first PMOS transistor and the drain of the second PMOS transistor are commonly coupled; and a body voltage control unit configured to control to supply one of the first power voltage and the second power voltage to the body of the first PMOS transistor and the body of the second PMOS transistor, wherein the one has a higher voltage level than the other.

In accordance with another exemplary embodiment of the present invention, a power voltage selection device includes a power voltage selection unit configured to selectively provide one of a first power voltage and a second power voltage; an output unit configured to receive a power voltage provided from the power voltage selection unit and output the power voltage provided from the power voltage selection unit through an output node; and a body voltage control unit configured to control to supply one of the first power voltage and the second power voltage to a body of a first PMOS transistor and a body of a second PMOS transistor included in the power voltage selection unit, and perform a latch-up protection operation, wherein the one has a higher voltage level than the other.

DETAILED DESCRIPTION

Figure 1:
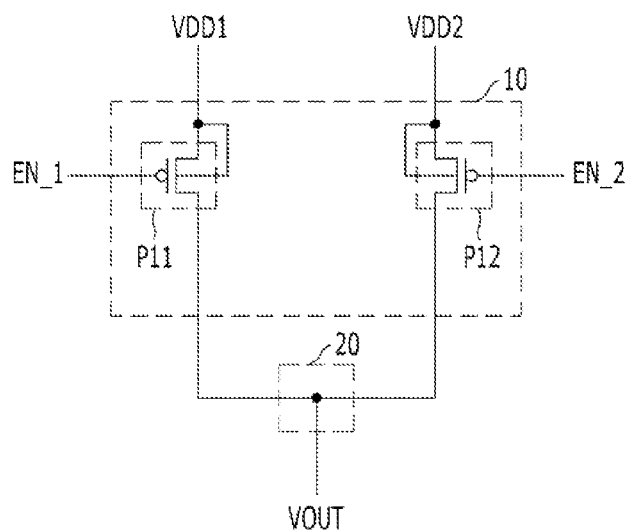
FIG. 1 is a circuit diagram illustrating a conventional power voltage selection device.
Figure 2:
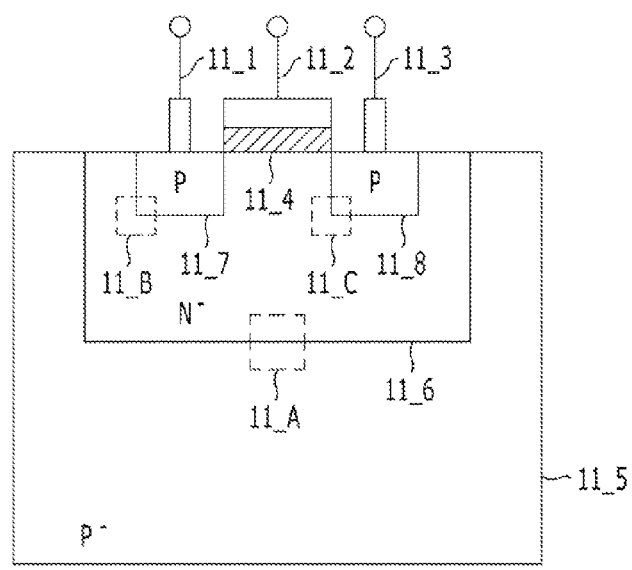
FIG. 2 is a cross sectional view of a conventional PMOS transistor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
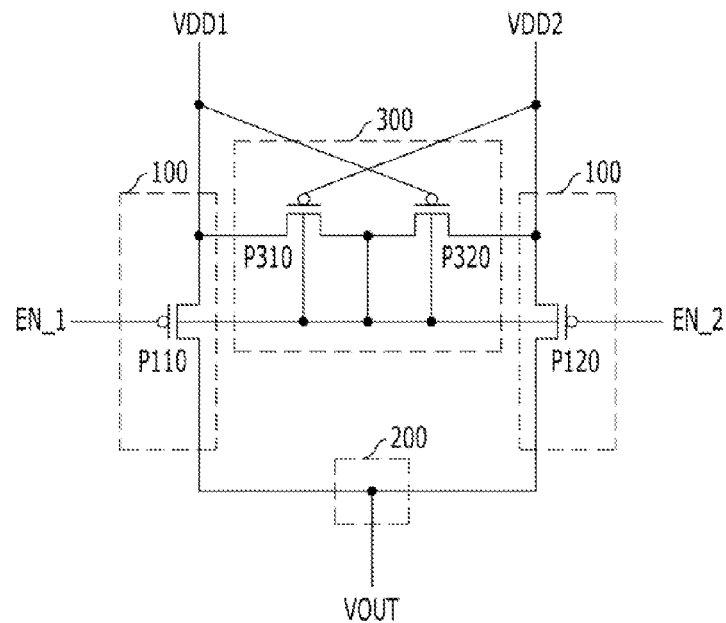
FIG. 3 is a circuit diagram illustrating a power voltage selection device in accordance with an embodiment of the present application.

FIG. 3 is a circuit diagram illustrating a power voltage selection device in accordance with an embodiment of the present application.

As shown in FIG. 3, a power voltage selection device in accordance with an embodiment of the present application includes a power voltage selection unit 100, an output unit 200, and a body voltage control unit 300.

The power voltage selection unit 100 selectively provides either a first power voltage VDD1 or a second power voltage VDD2 to the output unit 200.

The power voltage selection unit 100 includes a first PMOS transistor P110 and a second PMOS transistor P120.

The first power voltage VDD1 is supplied to a source of the first PMOS transistor P110 and a first enable signal EN_1 is input to a gate of the first PMOS transistor P110. The second power voltage VDD2 is supplied to a source of the second PMOS transistor P120 and a second enable signal EN_2 is input to a gate of the second PMOS transistor P120. A body of the first PMOS transistor P110 is coupled to a body of the second PMOS transistor P120.

The power voltage selection unit 100 selectively provides either the first power voltage VDD1 or the second power voltage VDD2 to the output unit 200. More specifically, the power voltage selection unit 100 may provide the first power voltage VDD1 to the output unit 200 by receiving the first enable signal EN_1 through a gate of the first PMOS transistor P110 and turning on the first PMOS transistor P110 in response to the first enable signal EN_1. Alternatively, the power voltage selection unit 100 may provide the second power voltage VDD2 to the output unit 200 by receiving the second enable signal EN_2 through a gate of the second PMOS transistor and turning on the second PMOS transistor P120 in response to the second enable signal EN_2.

The output unit 200 includes an output node VOUT. The output node VOUT is commonly coupled to the body of the first PMOS transistor P110 and the body of the second PMOS transistor P120. The first power voltage VDD1 or the second power voltage VDD2 that is received from the power voltage selection unit 100 is output through the output node VOUT.

The body voltage control unit 300 controls to supply one having a higher voltage level between the first power voltage VDD1 and the second power voltage VDD2 to the body of the first PMOS transistor P110 and the body of the second PMOS transistor P120. It is assumed that a voltage level of the first power voltage VDD1 is not same as that of the second power voltage VDD2.

The body voltage control unit 300 includes a third PMOS transistor P310 and a fourth PMOS transistor P320.

The first power voltage VDD1 is supplied to a source of the third PMOS transistor P310, the second power voltage VDD2 is supplied to a gate of the third PMOS transistor P310, and a body of the first PMOS transistor P110 is coupled to a body of the third PMOS transistor P310. The second power voltage VDD2 is supplied to a source of the fourth PMOS transistor P320, the first power voltage VDD1 is supplied to a gate of the fourth PMOS transistor P320, a drain of the third PMOS transistor P310 is coupled to a drain of the fourth PMOS transistor P320, and the body of the first PMOS transistor P110 is coupled to a body of the fourth PMOS transistor P320.

The body voltage control unit 300 prevents a latch-up by supplying one having a higher voltage level between the first power voltage VDD1 and the second power voltage VDD2 to the body of the first PMOS transistor P110 and the body of the second PMOS transistor P120. The detailed operation of the body voltage control unit 300 will be described as below.

Firstly, if a voltage level of the first power voltage VDD1 is higher than a voltage level of the second power voltage VDD2, the body voltage control unit 300 supplies the first power voltage VDD1 to the body of the first PMOS transistor P110 and the body of the second PMOS transistor P120.

More specifically, if the voltage level of the first power voltage VDD1 is higher than the voltage level of the second power voltage VDD2 and the voltage difference between the gate and the source of the third PMOS transistor P310 is higher than the threshold voltage of the third PMOS transistor P310, the third PMOS transistor P310 is turned on, the fourth PMOS transistor P320 is turned off, and the first power voltage VDD1 is supplied to the body of the first PMOS transistor P110 and the body of the second PMOS transistor P120.

Second, if a voltage level of the second power voltage VDD2 is higher than a voltage level of the first power voltage VDD1, the body voltage control unit 300 applies the second power voltage VDD2 to the body of the first PMOS transistor P110 and the body of the second PMOS transistor P120.

More specifically, if the voltage level of the second power voltage VDD2 is higher than the voltage level of the first power voltage VDD1 and the voltage difference between the gate and the source of the fourth PMOS transistor P320 is higher than the threshold voltage of the fourth PMOS transistor P320, the third PMOS transistor P310 is turned off, the fourth PMOS transistor P320 is turned on, and the second power voltage VDD2 is supplied to the body of the first PMOS transistor P110 and the body of the second PMOS transistor P120.

In other words, the body voltage control unit 300 prevents a latch-up that may occur in the power source selection unit 100 by controlling the third PMOS transistor P310 and the fourth PMOS transistor P320 so that one having a higher voltage level between the first power voltage and the second power voltage is supplied to the body of the first PMOS transistor P110 and the body of the second PMOS transistor P120.

Figure 4:
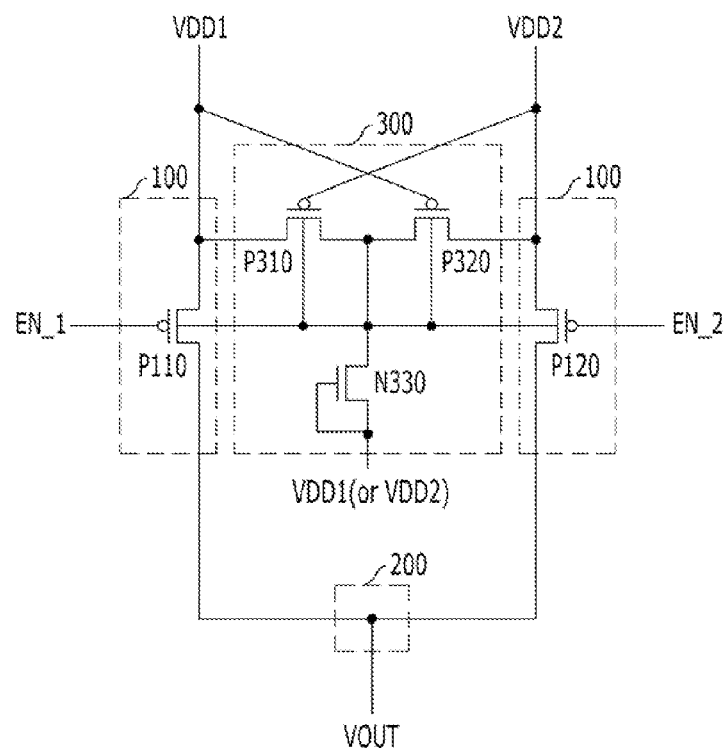
FIG. 4 is a circuit diagram illustrating a power voltage selection device in accordance with another embodiment of the present application.

FIG. 4 is a circuit diagram illustrating a power voltage selection device in accordance with another embodiment of the present application.

As shown in FIG. 4, a power voltage selection device in accordance with another embodiment of the present application includes a power voltage selection unit 100, an output unit 200, and a body voltage control unit 300.

The power voltage selection unit 100 provides selectively one of a first power voltage VDD1 and a second power voltage VDD2 to the output unit 200.

The power voltage selection unit 100 includes a first PMOS transistor P110 and a second PMOS transistor P120.

The first power voltage VDD1 is supplied to a source of the first PMOS transistor P110 and a first enable signal EN_1 is input to a gate of the first PMOS transistor P110. The second power voltage VDD2 is supplied to a source of the second PMOS transistor P120 and a second enable signal EN_2 is input to a gate of the second PMOS transistor P120). A body of the first PMOS transistor P110 is coupled to a body of the second PMOS transistor P120.

The power voltage selection unit 100 provides selectively one of the first power voltage VDD1 and the second power voltage VDD2 to the output unit 200. More specifically, the power voltage selection unit 100 may provide the first power voltage VDD1 to the output unit 200 by receiving the first enable signal EN_1 through a gate of the first PMOS transistor P110 and turning on the first PMOS transistor P110 in response to the first enable signal EN_1. Alternatively, the power voltage selection unit 100 may provide the second power voltage VDD2 to the output unit 200 by receiving the second enable signal EN_2 through a gate of the second PMOS transistor and turning on the second PMOS transistor P120 in response to the second enable signal EN_2.

The output unit 200 includes an output node VOUT. The output node VOUT is commonly coupled to the body of the first PMOS transistor P110 and the body of the second PMOS transistor P120. The first power voltage VDD1 or the second power voltage VDD2 that is received from the power voltage selection unit 100 is output through the output node VOUT.

The body voltage control unit 300 controls to supply one of the first power voltage VDD1 and the second power voltage VDD2 to the body of the first PMOS transistor P110 and the body of the second PMOS transistor P120. Here, it is assumed that a voltage level of the first power voltage VDD1 is higher than or same as that of the second power voltage VDD2.

Referring to FIG. 4, the body voltage control unit 300 includes a third PMOS transistor P310, a fourth PMOS transistor P320 and a first NMOS transistor N330.

The first power voltage VDD1 is supplied to a source of the third PMOS transistor P310, the second power voltage VDD2 is supplied to a gate of the third PMOS transistor P310, and a body of the first PMOS transistor P110 is coupled to a body of the third PMOS transistor P310.

The second power voltage VDD2 is supplied to a source of the fourth PMOS transistor P320, the first power voltage VDD1 is supplied to a gate of the fourth PMOS transistor P320 a drain of the third PMOS transistor P310 is coupled to a drain of the fourth PMOS transistor P320, and the body of the first PMOS transistor P110 is coupled to a body of the fourth PMOS transistor P320.

A drain of the first NMOS transistor N330 is commonly coupled to a gate of the first NMOS transistor N330 and a source of the first NMOS transistor N330 is coupled to the body of the first PMOS transistor P110.

Here, the drain of the first NMOS transistor N330 may be coupled to one of the first power voltage VDD1 and the second power voltage VDD2. Hereinafter, it is assumed that the drain of the first NMOS transistor N330 is coupled to the first power voltage VDD1.

The body voltage control unit 300 prevents a latch-up by supplying one having a higher voltage level of the first power voltage VDD1 and the second power voltage VDD2 to the body of the first PMOS transistor P110 and the body of the second PMOS transistor P120. The detailed operation of the body voltage control unit 300 will be described as below.

Firstly, if a voltage level of the first power voltage VDD1 is higher than a voltage level of the second power voltage VDD2, the body voltage control unit 300 applies the first power voltage VDD1 to the body of the first PMOS transistor P110 and the body of the second PMOS transistor P120.

More specifically, if the voltage level of the first power voltage VDD1 is higher than the voltage level of the second power voltage VDD2 and the voltage difference between the gate and the source of the third PMOS transistor P310 is higher than the threshold voltage of the third PMOS transistor P310, the third PMOS transistor P310 is turned on, the fourth PMOS transistor P320 is turned off, and the first power voltage VDD1 is supplied to the body of the first PMOS transistor P110 and the body of the second PMOS transistor P120.

Since the first power voltage VDD1 is supplied to the gate, the drain and the source of the first NMOS transistor N330, the first NMOS transistor N330 is turned off and is not operated.

Second, if a voltage level of the second power voltage VDD2 is higher than a voltage level of the first power voltage VDD1, the body voltage control unit 300 applies the second power voltage VDD2 to the body of the first PMOS transistor P110 and the body of the second PMOS transistor P120.

More specifically, if the voltage level of the second power voltage VDD2 is higher than the voltage level of the first power voltage VDD1 and the voltage difference between the gate and the source of the fourth PMOS transistor P320 is higher than the threshold voltage of the fourth PMOS transistor P320, the third PMOS transistor P310 is turned off, the fourth PMOS transistor P320 is turned on, and the second power voltage VDD2 is supplied to the body of the first PMOS transistor P110 and the body of the second PMOS transistor P120.

Since the first power voltage VDD1 is supplied to the gate and the drain of the first NMOS transistor N330 and the second power voltage VDD2 having a higher voltage level than the first power voltage VDD1 is supplied to the source of the first NMOS transistor N330, the first NMOS transistor N330 is turned off and does not operate.

Third, if a voltage level of the first power voltage VDD1 is same as a voltage level of the second power voltage VDD2, the body voltage control unit 300 applies a voltage, reduced as the amount as the threshold voltage of the first NMOS transistor 330 from the first power voltage VDD1, to the body of the first PMOS transistor P100 and the body of the second PMOS transistor P120.

More specifically, if the voltage level of the first power voltage VDD1 is same as the voltage level of the second power voltage VDD2, and a voltage difference between the gate and the source of the third PMOS transistor P310 is not higher than the threshold voltage of the third PMOS transistor P310, and the voltage difference between the gate and the source of the fourth PMOS transistor P320 is not higher than the threshold voltage of the fourth PMOS transistor P320, the third PMOS transistor P310 and the fourth PMOS transistor P320 are turned off and are not operated.

Here, the first power voltage VDD1 is supplied to the drain of the first NMOS transistor N330. The first NMOS transistor N330 applies a voltage, reduced as the amount as the threshold voltage of the first NMOS transistor N330 from the first power voltage VDD1, to the body of the first PMOS transistor P110 and the body of the second PMOS transistor P120.

For the reference, if the voltage level of the first power voltage VDD1 is same as the voltage level of the second power voltage VDD2, the first NMOS transistor N330 having a low threshold voltage is used so that the highest voltage is supplied to the body of the first PMOS transistor P110 and the body of the second PMOS transistor P120.

Further, in another embodiment of the present application, a voltage level having a same voltage level as the first power voltage VDD1 may be supplied to the body of the first PMOS transistor P110 and the body of the second PMOS transistor P120 by supplying a third power voltage that is higher as the amount as the threshold voltage of the first NMOS transistor N330 than the first power voltage VDD1, to the drain of the first NMOS transistor N330.

As described above, the power voltage selection device in accordance with embodiments of the present application applies one having a higher voltage level between the first power voltage VDD1 and the second power voltage VDD2 to the body of the first PMOS transistor 110 and the body of the second PMOS transistor P120, if the voltage level of the first power voltage VDD1 is different from the voltage level of the second power voltage VDD2. The power voltage selection device applies a voltage, reduced as the amount as the threshold voltage of the first NMOS transistor N330 from the first power voltage VDD1 and the second power voltage VDD2, to the body of the first PMOS transistor 110 and the body of the second PMOS transistor P120, if the voltage level of the first power voltage VDD1 is same as the voltage level of the second power voltage VDD2.

Thus, a parasitic transistor is always turned off and a latch-up does not occur.

As described above, the power voltage selection device in accordance with exemplary embodiments of the present application performs a latch-up protection operation since a parasitic transistor maintains an inverse bias state.

While the present invention has been described with respect to the specific embodiments, it will be apparent to those skilled in the art that various changes and modifications may be made without departing from the spirit and scope of the invention as defined in the following claims.

What is claimed is:

1. A power voltage selection device, comprising:
a first power voltage and a second power voltage;
a power selection unit having a first PMOS transistor and a second PMOS transistor, wherein the first power voltage is supplied to a source of the first PMOS transistor, a gate of the first PMOS transistor receives a first enable signal, the second power voltage is supplied to a source of the second PMOS transistor, a gate of the second PMOS transistor receives a second enable signal, and a body of the first PMOS transistor is coupled to a body of the second PMOS transistor;
an output unit having a common node to which a drain of the first PMOS transistor and a drain of the second PMOS transistor are commonly coupled; and
a body voltage control unit configured to control to supply the first power voltage to the body of the first PMOS transistor and the body of the second PMOS transistor, when the first power voltage is higher than the second power voltage, and to supply the second power voltage to the body of the first PMOS transistor and the body of the second PMOS transistor, when the second power voltage is higher than the first power voltage.

2. The power voltage selection device of claim 1, wherein the body voltage control unit comprises a third PMOS transistor and a fourth PMOS transistor,
wherein the first power voltage is supplied to a source of the third PMOS transistor, the body of the first PMOS transistor is coupled to a drain of the third PMOS transistor, and a gate and a body of the third PMOS transistor are commonly coupled to each other, and
wherein the second power voltage is supplied to a source of the fourth PMOS transistor, the first power voltage is supplied to a gate of the fourth PMOS transistor, a drain of the fourth PMOS transistor is coupled to a body of the second PMOS transistor, and a gate and a body of the fourth transistor are commonly coupled to each other.

3. The power voltage selection device of claim 2, wherein the body voltage control unit further comprises a first NMOS transistor having a drain coupled to the first power voltage or the second power voltage, a source commonly coupled to the body of the first PMOS transistor and the body of the second PMOS transistor, and a gate commonly coupled to the drain of the first NMOS transistor.

4. The power voltage selection device of claim 3, wherein the first NMOS transistor has a low threshold voltage.

5. The power voltage selection device of claim 3, wherein a voltage that is higher than a voltage level of the first power voltage or the second power voltage substantially as same amount as a threshold voltage of the first NMOS transistor is supplied to the drain of the first NMOS transistor.

6. A power voltage selection device, comprising:
a power voltage selection unit configured to selectively provide one of a first power voltage and a second power voltage;
an output unit configured to receive a power voltage provided from the power voltage selection unit and output the power voltage provided from the power voltage selection unit through an output node; and
a body voltage control unit configured to control to supply the first power voltage to a body of a first PMOS transistor and a body of a second PMOS transistor included in the power voltage selection unit, when the first power voltage is higher than the second power voltage, to supply the second power voltage to the body of the first PMOS transistor and the body of the second PMOS transistor, when the second power voltage is higher than the first power voltage, and to perform a latch-up protection operation.

7. The power voltage selection device of claim 6, wherein the body voltage control unit comprises a third PMOS transistor and a fourth PMOS transistor,
wherein the first power voltage is supplied to a source of the third PMOS transistor, the body of the first PMOS transistor is coupled to a drain of the third PMOS transistor, and a gate and a body of the third PMOS transistor are commonly coupled to each other, and
wherein the second power voltage is supplied to a source of the fourth PMOS transistor, the first power voltage is supplied to a gate of the fourth PMOS transistor, a drain of the fourth PMOS transistor is coupled to a body of the second PMOS transistor, and a gate and a body of the fourth transistor are commonly coupled to each other.

8. The power voltage selection device of claim 7, wherein the body voltage control unit performs the latch-up protection operation by controlling the third PMOS transistor and the fourth PMOS transistor so that a voltage having a higher voltage level between the first power voltage and the second power voltage is supplied to the body of the first PMOS transistor and the body of the second PMOS transistor.

9. The power voltage selection device of claim 6, wherein the body voltage control unit further comprises a first NMOS transistor having a drain coupled to the first power voltage or the second power voltage, a source commonly coupled to the body of the first PMOS transistor and the body of the second PMOS transistor, and a gate commonly coupled to the drain of the first NMOS transistor.

10. The power voltage selection device of claim 9, wherein the first NMOS transistor has a low threshold voltage.

11. The power voltage selection device of claim 9, wherein a voltage that is higher than a voltage level of the first power voltage or the second power voltage substantially as same amount as a threshold voltage of the first NMOS transistor is supplied to the drain of the first NMOS transistor.

\* \* \* \* \*